United States Patent
Van Kampen et al.

(10) Patent No.: US 9,708,177 B2
(45) Date of Patent: Jul. 18, 2017

(54) MEMS DEVICE ANCHORING

(75) Inventors: Robertus Petrus Van Kampen, S-Hertogenbosch (NL); Mickael Renault, San Jose, CA (US); Vikram Joshi, Mountain View, CA (US); Richard L. Knipe, McKinney, TX (US); Anartz Unamuno, Dresden (DE)

(73) Assignee: CAVENDISH KINETICS, INC., San Jose, CA (US)

( * ) Notice: Subject to any disclaimer, the term of this patent is extended or adjusted under 35 U.S.C. 154(b) by 744 days.

(21) Appl. No.: 14/342,387

(22) PCT Filed: Aug. 31, 2012

(86) PCT No.: PCT/US2012/053327
§ 371 (c)(1),
(2), (4) Date: Apr. 15, 2014

(87) PCT Pub. No.: WO2013/033526
PCT Pub. Date: Mar. 7, 2013

(65) Prior Publication Data
US 2014/0300249 A1    Oct. 9, 2014

Related U.S. Application Data

(60) Provisional application No. 61/530,691, filed on Sep. 2, 2011.

(51) Int. Cl.
*B81B 7/00* (2006.01)
*B81C 1/00* (2006.01)
(Continued)

(52) U.S. Cl.
CPC ............ *B81B 7/00* (2013.01); *B81C 1/00039* (2013.01); *H01G 5/16* (2013.01); *H01H 59/0009* (2013.01);
(Continued)

(58) Field of Classification Search
CPC ................ B81B 2201/038; B81B 7/00; B81B 2207/015
(Continued)

(56) References Cited

U.S. PATENT DOCUMENTS 5,051,643 A * 9/1991 Dworsky ........... H01H 59/0009
200/181
6,426,687 B1 * 7/2002 Osborn ................... H01P 1/127
200/181

(Continued)

FOREIGN PATENT DOCUMENTS

| CN | 1816890 A | 8/2006 |
|---|---|---|
| CN | 1975956 A | 6/2007 |
| JP | 2007-178882 A | 7/2007 |

OTHER PUBLICATIONS

Japanese Office Action (with attached English translation) for Application No. 2014-528634; dated Apr. 19, 2016; 9 total pages.

(Continued)

*Primary Examiner* — Thanh Lam
(74) *Attorney, Agent, or Firm* — Patterson & Sheridan, LLP

(57) ABSTRACT

Embodiments of the present invention generally relate to a MEMS device that is anchored using the layer that is deposited to form the cavity sealing layer and/or with the layer that is deposited to form the pull-off electrode. The switching element of the MEMS device will have a flexible or movable portion and will also have a fixed or anchor portion that is electrically coupled to ground. The layer that is used to seal the cavity in which the switching element is disposed can also be coupled to the fixed or anchor portion of the switching element to anchor the fixed or anchor portion within the cavity. Additionally, the layer that is used to form one of the electrodes may be used to provide additional leverage for anchoring the fixed or anchor portion (Continued)

within the cavity. In either situation, the movement of the flexible or movable portion is not hindered.

27 Claims, 8 Drawing Sheets

(51) Int. Cl.
    *H01H 59/00* (2006.01)
    *H01G 5/16* (2006.01)
(52) U.S. Cl.
    CPC . *B81B 2201/016* (2013.01); *B81B 2203/0307* (2013.01); *B81C 2203/0136* (2013.01); *Y10T 29/49105* (2015.01)
(58) Field of Classification Search
    USPC .................................................. 310/300, 309
    See application file for complete search history.

(56) References Cited

U.S. PATENT DOCUMENTS

| | | | |
|---|---|---|---|
| 2004/0157364 A1 | 8/2004 | Combi et al. | |
| 2004/0188783 A1* | 9/2004 | Funaki | B81B 3/0021 257/415 |
| 2005/0007217 A1* | 1/2005 | Deligianni | H01H 59/0009 335/78 |
| 2007/0120445 A1 | 5/2007 | Kim et al. | |
| 2007/0236307 A1 | 10/2007 | Liu | |
| 2007/0256917 A1* | 11/2007 | Oberhammer | H01H 59/0009 200/181 |
| 2010/0116632 A1* | 5/2010 | Smith | B81B 7/04 200/181 |
| 2010/0163376 A1* | 7/2010 | Yoon | H02N 1/006 200/181 |
| 2011/0079495 A1 | 4/2011 | Knipe et al. | |
| 2011/0221300 A1* | 9/2011 | Shimanouchi | B81C 1/00698 310/300 |

OTHER PUBLICATIONS

Chinese Office Action (with attached English translation) for Application No. 201280042820.6; dated Aug. 4, 2016; 8 total pages.
International Search Report and Written Opinion issued in corresponding application No. PCT/US2012/053327 on Apr. 9, 2013.
Chinese Office Action (with attached English translation) for Application No. 201280042820.6 dated Jun. 3, 2015; 21 total pages.
Japanese Office Action dated Nov. 22, 2016 for Japanese Patent Application No. 2014-528634.

* cited by examiner

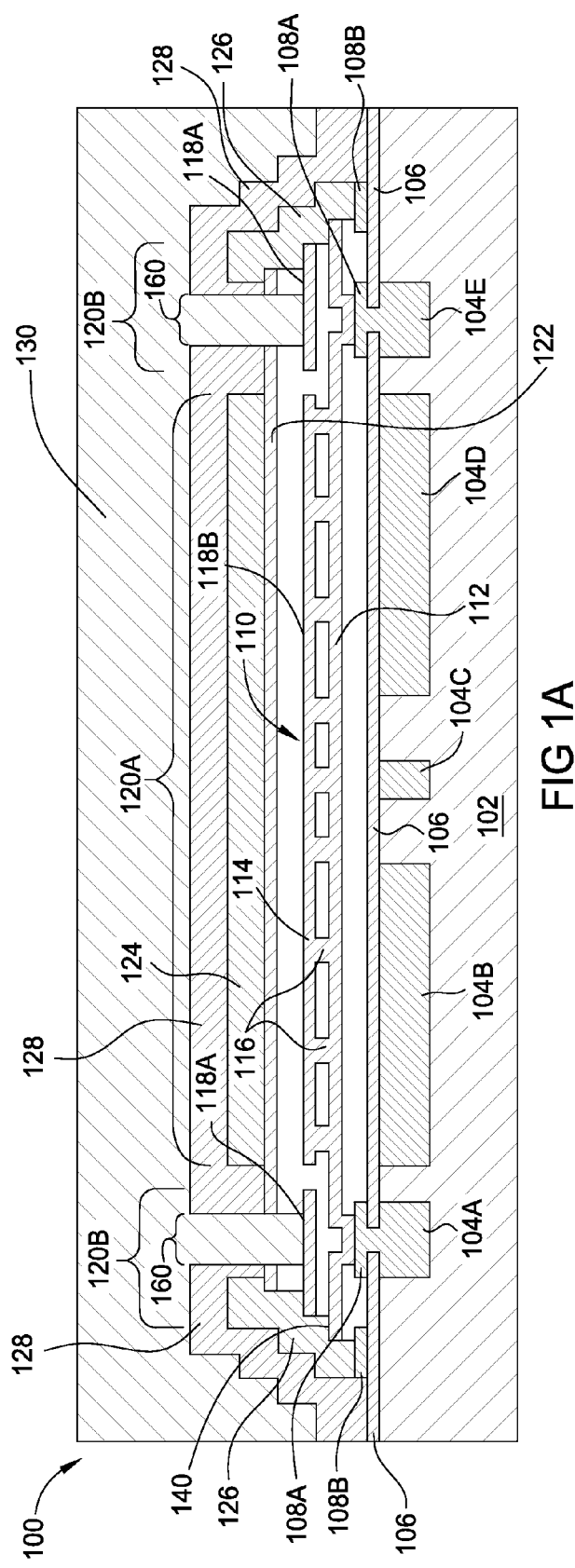
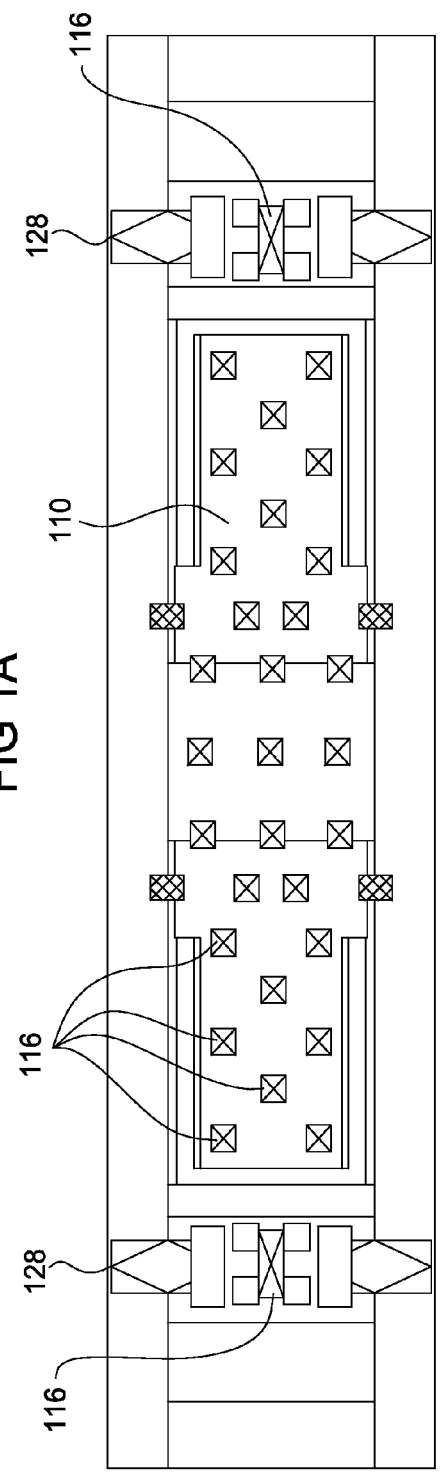
FIG 1A
FIG 1B

MEMS DEVICE ANCHORING

BACKGROUND OF THE INVENTION

Field of the Invention

Embodiments of the present invention generally relate to a micro-electromechanical (MEMS) device that is anchored using the layers that are used to form both the sealing layer and the pull-off electrode.

Description of the Related Art

As the size of semiconductors continues to shrink, so does the MEMS devices that are coupled to the semiconductors. MEMS devices may be used as miniature relay switches, capacitance switches, non-volatile memory elements and for many more applications. The MEMS devices have a switch or cantilever that moves between at least two positions to either permit or deny a current from flowing through the switch.

MEMS devices are made using similar processing steps to those found in semiconductor foundries and therefore can be manufactured cost effectively on a wafer scale. One of the issues found in shrinking MEMS devices to the scale of less than a few micrometers is the ability of the switch or cantilever to be pulled into contact with an electrode and then released back to its original state repeatedly and reliably. Due to the length of the cantilever or switch that is necessary to create the flexibility of the cantilever or switch, the switch or cantilever may break at the anchor portion and cause the MEMS device to fail.

Therefore, there is a need in the art for a MEMS device that is able to move between two electrodes without breaking at the anchor location. There is also a need in the art for a method to manufacture such a device.

SUMMARY OF THE INVENTION

The present invention generally relates to a MEMS device that is anchored using the layer that is deposited to form the cavity sealing layer and/or with the layer that is deposited to form the pull-off electrode. The switching element of the MEMS device will have a flexible or movable portion that moves between two electrodes. The switching element will also have a fixed or anchor portion that is electrically coupled to ground. The layer that is used to seal the cavity in which the switching element is disposed can also be coupled to the fixed or anchor portion of the switching element to anchor the fixed or anchor portion within the cavity. Additionally, the layer that is used to form one of the electrodes may be used to provide additional leverage for anchoring the fixed or anchor portion within the cavity. In either situation, the movement of the flexible or movable portion is not hindered.

In one embodiment, a MEMS device includes a first electrode, a second electrode and a switching element movable between the first electrode and the second electrode. The switching element is disposed within a cavity. The MEMS device also includes a sealing layer that seals the cavity. At least a portion of the sealing layer is in contact with at least a portion of the switching element.

In another embodiment, a MEMS device includes a waffle patterned switching element disposed within a cavity. The switching element has at least one anchor portion and a flexible portion. The MEMS device also includes a plurality of walls that bound the cavity. At least a portion of at least one wall of the plurality of walls is coupled to the at least one anchor portion.

In another embodiment, a MEMS device includes one or more first electrodes embedded within a substrate and a second electrode spaced from the one or more first electrodes that is electrically connected to an electrical contact embedded within the substrate. The MEMS device also includes a plurality of switches that are each movable between the one or more first electrodes and the second electrode within a cavity.

In another embodiment, a MEMS device fabrication method includes fabricating a switching element above a substrate. The switching element is disposed above one or more pull-in electrodes and has both an anchor portion and a flexible portion. The method also includes depositing an electrically conductive layer above the switching element and in contact with the anchor portion. The method additionally includes patterning the electrically conductive layer to form a first portion that remains in contact with the anchor portion and a pull-off electrode that is electrically isolated from the first portion.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 1A is a schematic cross-sectional view of a MEMS device according to one embodiment.

FIG. 1B is a top view of the MEMS device of FIG. 1A.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 2A:
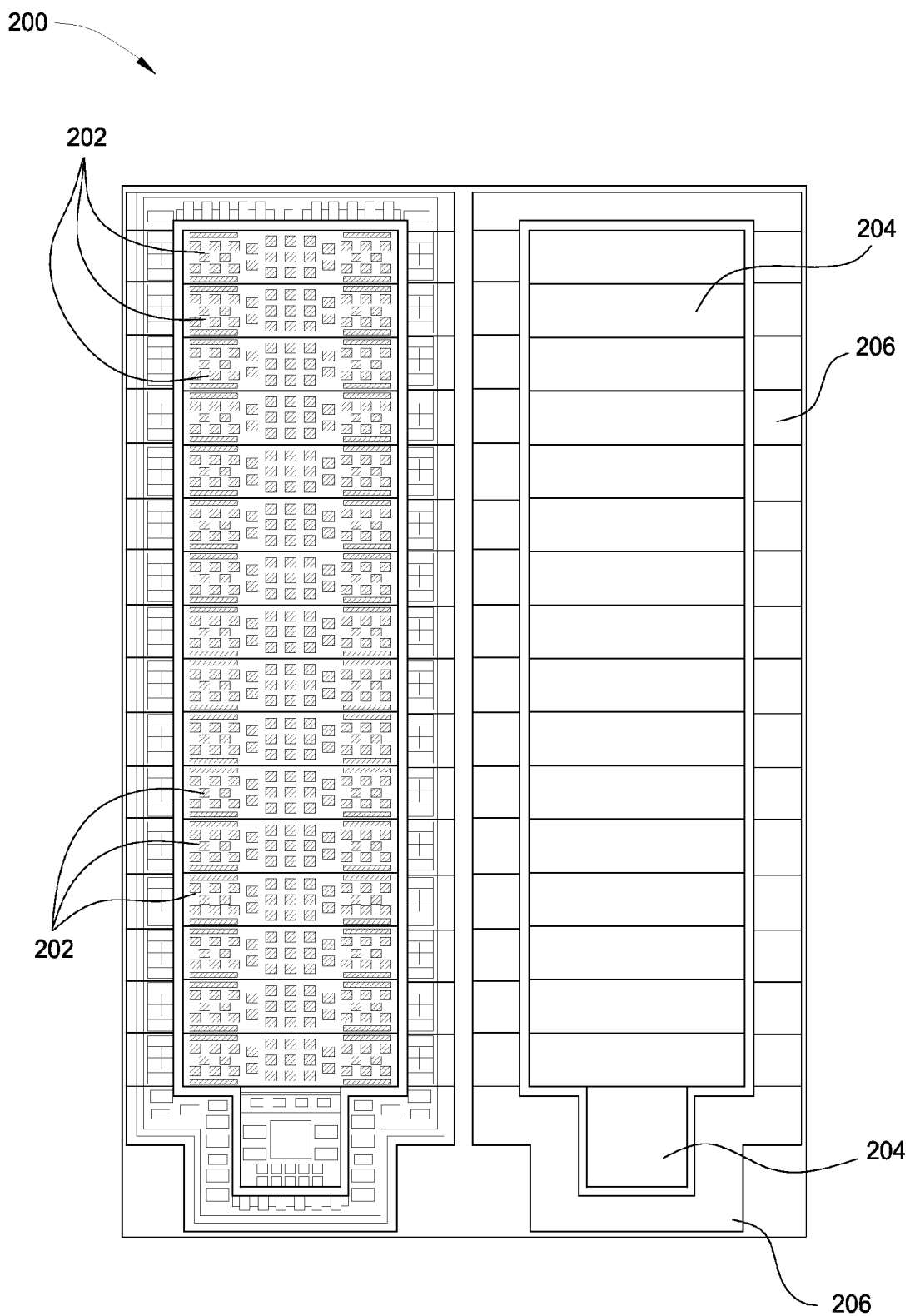
FIG. 2A is a top view of a MEMS device according to another embodiment.

The present invention generally relates to a MEMS device that is anchored using the layer that is deposited to form the cavity sealing layer and/or with the layer that is deposited to form the pull-off electrode. The switching element of the MEMS device will have a flexible or movable portion that moves between two electrodes. The switching element will also have a fixed or anchor portion that is electrically coupled to ground. The layer that is used to seal the cavity in which the switching element is disposed can also be coupled to the fixed or anchor portion of the switching element to anchor the fixed or anchor portion within the cavity. Additionally, the layer that is used to form one of the electrodes may be used to provide additional leverage for anchoring the fixed or anchor portion within the cavity. In either situation, the movement of the flexible or movable portion is not hindered.

FIG. 1A is a schematic cross-sectional view of a MEMS device 100 according to one embodiment. The MEMS device 100 is fabricated by forming a plurality of electrodes 104A-104E within a substrate 102. The substrate 102 may comprise a single layer material such as a semiconductor based substrate for a stand-alone MEMS device or generically a multilayer structure such as is produced in a back end of the line (BEOL) process. Suitable materials that may be used for the electrodes 104A-104E include electrically conductive materials commonly utilized in BEOL processes such as copper, aluminum, titanium, tantalum, tungsten, titanium nitride, tantalum nitride, tungsten nitride, aluminum nitride and combinations thereof. The electrodes 104A-104E may be formed by well known deposition methods such as physical vapor deposition (PVD), chemical vapor deposition (CVD), electroplating and atomic layer deposition (ALD) and well known patterning methods such as etching and dual damascene processing steps. Two of the electrodes 104B, 104D, will function as pull-in electrodes to move the switching element into a position adjacent the RF electrode 104C. The other two electrodes 104A, 104E will be electrically grounded. It is to be understood that while five electrodes 104A-104E are shown, it is contemplated that a single grounding electrode may be present, a single pull-in electrode may be present and a single RF electrode may be present.

Over the electrodes 104A-104E, a thin dielectric layer 106 is deposited and then patterned to expose the ground electrodes 104A, 104E. Suitable materials that may be utilized for the thin dielectric layer 106 include silicon nitride, silicon oxide, silicon carbide, alumina, silicon oxynitride and other dielectric materials suitable for use in a CMOS device. The dielectric layer 106 may be deposited by well known deposition methods including CVD and ALD. The thin dielectric layer 106 is useful for several reasons including: electrical isolation between switching element 110 and electrodes 104B-104D and reducing recombination of etching gas ions when removing the sacrificial material.

Over the thin dielectric layer 106, electrically conductive material may be blanket deposited and then patterned to form the electrical interconnects 108A to the ground electrodes 104A, 104E. Additionally, the electrically conductive material may be patterned to form pads 108B that may be utilized as a seed material for deposition of anchoring material to be deposited at a later time. Suitable materials for the electrical interconnects 108A and pads 108B include electrically conductive materials commonly utilized in BEOL processes such as copper, aluminum, titanium, tantalum, tungsten, titanium nitride, and combinations thereof. The electrically conductive material may be deposited by well known deposition methods such as PVD, CVD, and ALD and the patterned by well known patterning methods such as etching.

A sacrificial material is then deposited over the exposed dielectric layer 106 as well as the electrical interconnects 108A and pads 108B. The sacrificial material is patterned to expose the interconnects 108A. Suitable materials for the sacrificial material include spin-on glass or spin on dielectric containing a long chain molecule with a carbon backbone. Such a material would need to have a low silicon content, because the sacrificial etch to remove carbon based compounds often leave residues if the sacrificial material contains silicon. The sacrificial material may be deposited by well known deposition methods such as spin coating, CVD and ALD. The sacrificial material is termed a sacrificial material because the material is used to at least partially define the cavity and will be removed at a later time in the production process. Thus, the sacrificial material is used and 'sacrificed' or removed to form a cavity.

The switching element 110 may then be formed. The switching element 110 may comprise a multilayer structure including a first structural layer 112. The first structural layer 112 is coupled to the electrical interconnects 108A and spans the length between the electrical interconnects 108A. A second structural layer 114 is then disposed over the first structural layer 112 and coupled to the first structural layer 112 by a plurality of posts 116. Suitable materials that may be used for the first structural layer 112, second structural layer 114 and posts 116 include titanium nitride, titanium aluminum, tungsten, copper, titanium aluminum nitride, aluminum nitride, aluminum and combinations thereof and multilayer structures such as titanium nitride/titanium aluminum nitride/titanium nitride. The first switching element 110 may be formed by depositing the material using well known deposition methods such as PVD, CVD, and ALD and then patterning the material by well known patterning methods such as etching. The second structural layer 114 is patterned to have a first portion 118A that is axially aligned with the ground electrodes 104A, 104E. As can be seen from FIG. 1A, the first portion 118A, does not extend the full length of the first structural layer 112 and thus, a ledge 140 is formed. The ledge 140 is the portion of the first structural layer 112 that is not covered by the first portion 118A. The second structural layer 114 also has a second portion 118B that will be part of the flexible portion 120A of the switching element 110. As completed, the switching element 110 has a waffle-like appearance. FIG. 1B is a top view of the MEMS device 100 of FIG. 1A. In the top view of the MEMS device 100, the posts 116 are shown to be staggered to create the waffle-like appearance and increase the structural integrity of the switching element 110.

Additional sacrificial material may be deposited over the switching element 110 and in between formation of the first structural layer 112 and the second structural layer 114. The additional sacrificial material, together with the first deposited sacrificial material, define the shape and boundary of the cavity within which the switching element 110 will move. Over the last deposited sacrificial material, a second dielectric layer 122 may then be deposited. The second dielectric layer 122 may be deposited using well known deposition methods and materials as discussed above with regards to dielectric layer 106.

The second dielectric layer 122 is then patterned and etched to define the outline of the cavity. In the same step, the sacrificial layers are etched whereby the structural layers 118A, 112 serve as a hardmask to provide a gradual step-down of the cavity sidewalls. This multi-step step-down improves the integrity of the cavity walls 126.

An electrically conductive material is then deposited. The electrically conductive material will be utilized to not only form a pull-off electrode 124 to move the switching element 110 to a position spaced from the RF electrode 104C, but also to directly couple to the anchor portion 120B of the switching element 110 and provide at least some leverage to prevent the anchor portion 120B from detaching from the ground electrodes 104A, 104E. The electrically conductive material is deposited on the ledge 140 as well as on at least a portion of the first portion 118A. Thus, the electrically conductive material provides additional leverage to anchor the anchor portion 120B of the switching element 110. The electrically conductive material also defines at least a portion of the walls that surround the cavity. Therefore, the same layer that is deposited to form the pull-off electrode 124 is utilized to form the cavity walls 126 and to anchor the anchor portion 120B of the switching element 110. It is to be understood that while the pull-off electrode 124 is shown to be above the switching element 110, the pull-off electrode may be electrically connected to the a material that is disposed below the switching element 110. Additionally, the cavity walls 126 are grounded through the ground electrodes 104A, 104E. Suitable materials for the electrically conductive material include electrically conductive materials commonly utilized in BEOL processes such as copper, aluminum, titanium, tantalum, tungsten, titanium nitride, and combinations thereof. The electrically conductive material may be deposited by well known deposition methods such as PVD, CVD, and ALD and then patterned by well known patterning methods such as etching.

The electrically conductive material is patterned by etching through the electrically conductive material to form the pull-off electrode 124 that is spaced from the walls 126. After the electrically conductive material is patterned, a dielectric roof 128 may be deposited over the electrically conductive material and over the exposed second dielectric layer 122 that is between the walls 126 and the pull-off electrode 124. The dielectric roof 128 provides electrical isolation between the pull-off electrode 124 and the walls 126 that comprise the electrically conductive material. The dielectric roof 128 encapsulates the MEMS device 100. It is to be understood that the walls 126 need not be present, but rather, the dielectric roof 128 may be deposited such that it functions to not only encapsulate, but to function as the walls for the cavity. The dielectric roof 128 may be deposited using well known deposition methods and materials as discussed above with regards to dielectric layer 106.

One or more release holes 160 may then be formed through the dielectric roof 128 and the second dielectric layer 122. The release holes 160 are formed at a location that is axially/vertically aligned with the first portion 118A and thus, the anchor portions 120B. An etching gas is then introduced to remove the sacrificial material and free the switching element to move within the cavity. Suitable etching gases that may be used include hydrogen or oxygen based gases such as $H_2$, $NH_3$, $O_2$, $O_3$, $N_2O$ or any other etching gas that produces H, O.

The cavity is then sealed by depositing a sealing layer 130 over the dielectric roof 128 and within the release holes 160. The sealing layer 130 is deposited through the release holes 160 and is in contact with the anchor portion 120B to provide additional leverage and prevent the anchor portion 120B from detaching from the ground electrodes 104A, 104E. The sealing material that extends through the release holes 160 and is in contact with the anchoring portion 120B is axially/vertically aligned with the first portion 118A. Suitable materials for the sealing layer 130 include silicon dioxide and silicon nitride. The sealing layer 130 may be deposited by a HDP-CVD process operated at low pressure (i.e., within the mTorr range), and a temperature of about 200 degrees Celsius. HDP-CVD is a process that is beneficial for depositing material in high aspect ratio openings such as the release holes 160. The release holes 160 have an aspect ratio of about 2.4:1 whereby the height of the release holes 160 are about 3 μm and the width is about 1.25 μm. In order to deposit the sealing layer 130, a silicon based processing gas, such as silane, is introduced along with either an oxygen containing gas, such as $N_2O$, or $O_2$, for depositing silicon dioxide or a nitrogen containing gas, such as $N_2$ and/or $NH_3$, for depositing silicon nitride.

HDP-CVD is beneficial in depositing the sealing layer 130 because HDP-CVD is a generally directional deposition method whereby material tends to deposit onto the exposed surfaces (namely the first portion 118A and the dielectric roof 128 with a minimal amount of material depositing on the sidewalls of the release holes or spreading out into the cavity. Thus, HDP-CVD will deposit the sealing layer 130 without void formation (which occurs when material builds up on the sidewalls of a high aspect ratio opening nearly as fast as material builds up on the bottom of a high aspect ratio opening). HDP-CVD will also deposit the sealing layer 130 without spreading out into the cavity and depositing onto structural portion 118B. While other deposition methods may be considered, HDP-CVD is preferred. Other methods considered include sputtering (including resputtering) and PECVD. However, for any AR above unity, sputtering and PECVD, may leave voids within the deposited material within the release hole and thus lessen the strength for anchoring the anchor portions 120B. Additionally, PECVD may spread out within the cavity and deposit on undesired areas such as on the structural layers 118B, 112.

In operation, the switching element 110 is moved by applying an electrical bias to either the pull-in electrodes 104B, 104D or to the pull-off electrode 124. The flexible portion 120A of the switching element 110 moves while the anchor portion 120B is fixedly attached to the ground electrodes 104A, 104E. The sealing layer 130, the dielectric roof 128 and the electrically conductive walls 126 all provide additional leverage to ensure the anchor portion 120B does not detach from the ground electrodes 104A, 104E. As shown in FIG. 1A, both ends of the switching element 110 have anchoring portions 120B and both anchoring portion 120B are directly coupled to both the sealing layer 130, the dielectric roof 128 as well as the electrically conductive material that was deposited to form the pull-off electrode 124 and conductive sidewalls 126.

FIG. 2A is a top view of a MEMS device 200 according to another embodiment. As shown in FIG. 2A, multiple switching elements 202 are disposed within a single cavity. The switching elements 202 may be fabricated in accordance with the fabrication method discussed above. On the left hand side, the devices 202 are shown in the cavity. On the right hand side, the pull-off electrode connection 204 is shown in relation to the ground electrode connection 206. As can be seen from FIG. 2A, the pull-off electrode, which resides above the switching elements 202, is electrically connected to an electrically conductive material disposed below the switching element 202 through an electrical connection disposed to the side of the cavity. The ground electrical connection 206 is electrically insulated from the pull-off electrode connection 204 and surrounds the pull-off electrode connection 204.

Figure 2C:
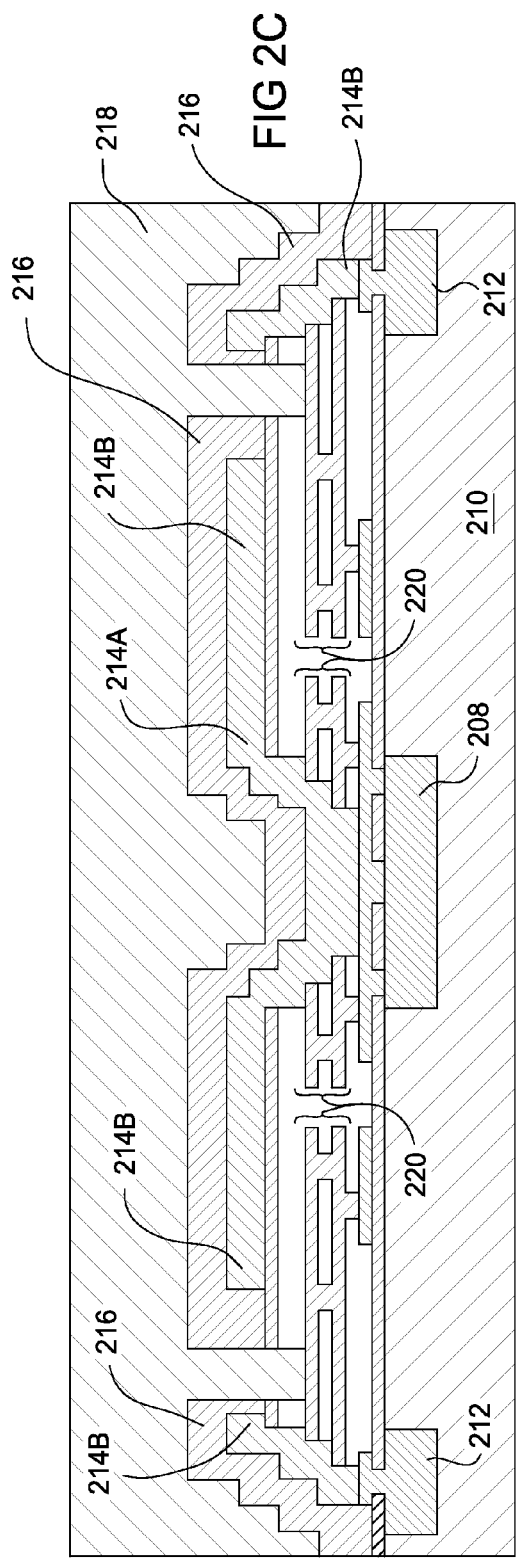
FIG. 2C is a schematic cross-sectional view of the close up view of FIG. 2B.
Figure 2B:
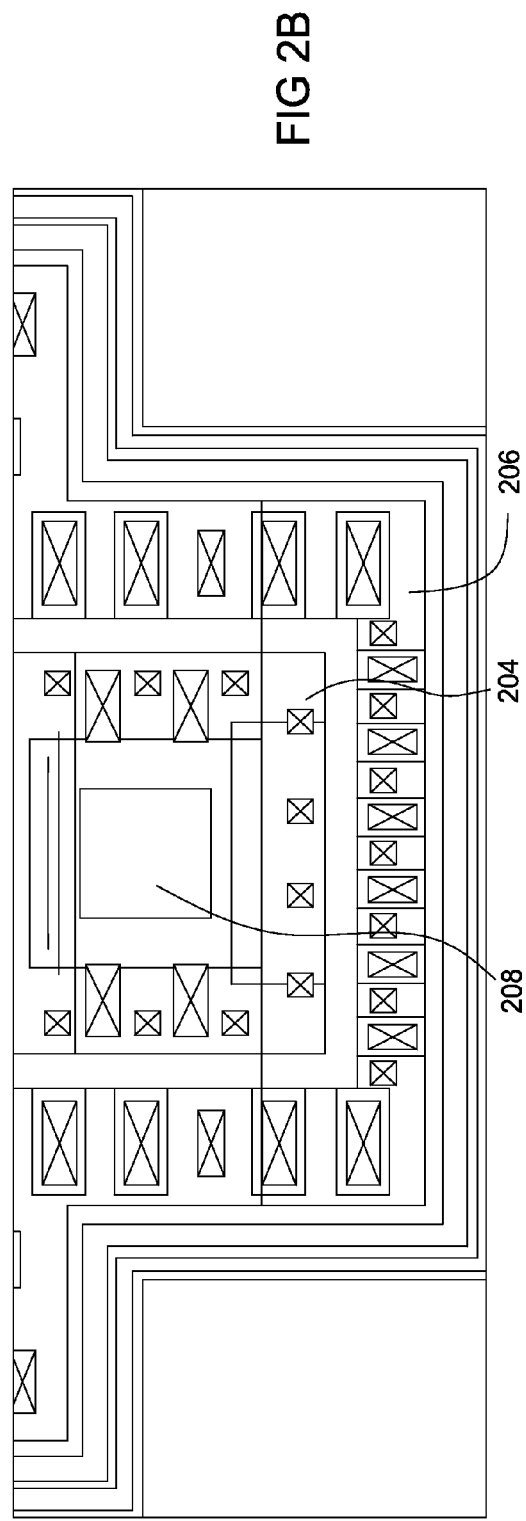
FIG. 2B is a close up view of a portion of the MEMS device of FIG. 2A.

FIG. 2B is a close up view of a portion of the MEMS device 200 of FIG. 2A. FIG. 2C is a schematic cross-sectional view of the close up view of FIG. 2B. The MEMS device 200 includes the pull-off electrode 208 and ground electrodes 212 embedded within the substrate 210. The cavity sealing layer 218 and dielectric roof 216 are also present. The electrically conductive material 214A is electrically coupled to the pull-off electrode 208. Additionally, electrically conductive material 214B that was deposited along with electrically conductive material 214A is coupled to the ground electrodes 212. It is to be understood that the electrically conductive material 214B need not be present as the sidewalls, but rather, the dielectric roof 216 may be deposited such that it functions as the walls for the cavity. Also shown in FIG. 2C is the multiple layers 220 that were deposited to form the switching element. As shown in FIGS. 2A-2C, the pull-off electrode, which is disposed above the switching elements 202, is electrically coupled to an electrical connection that is below the switching element.

MEMS applications require chemical and environmental protection (i.e., an environment free of external contaminants like water, dust particles, etc.). Chemical and environmental protection can be achieved by using a cavity. Chemical and environmental protection also requires mechanical protection guaranteeing that the subsequent processes will not lead to any mechanical damage on the cavity or to the enclosed MEMS device. Additionally, for some applications, e.g., RF variable capacitors, it is also important to control the shape of the roof of the cavity with high controllability to obtain the required RF performance.

A method to control the shape of the cavity will now be described. Control of the shape of the cavity is achieved by making use of a stack of various layers. The optimal shape of the stack can be tailored by selecting the appropriate materials and adjusting their thicknesses and deposition stresses. There are several advantages to utilizing a multi-layer stack of materials to control the shape of the cavity. One advantage is that the multi-layer stack provides environmental & mechanical protection. Another advantage is that it is possible to control the overall shape (e.g., dome) of the cavity. Multi-layer stacks can eliminate/reduce overall doming caused by non-planarity of sacrificial layers. Multi-layer stacks can also be used to increase dome (positive or negative) direction. The process discussed herein permits use of a two-step approach to building the cavity. In the first step, which occurs before releasing the switching element, involves making the cavity strong enough so that during and after release, the cavity is stable and does not buckle. In the second step, which occurs after releasing the switching element, shape control layers and a passivation layer are added. The cavity obtained post passivation can be made robust enough to withstand the pressure of various packaging schemes like underfilling from Flip Chip packaging or plastic molding. The process discussed herein is CMOS compatible and low cost. However, it should be noted that due to the deposition of multiple layers, opening release holes could be considered slightly more complicated as compared to a single layer. Additionally, filling the release holes after the sacrificial material is removed involves controlling how far the material that fills the release holes travels within the cavity before the release holes are closed.

Figure 3A:
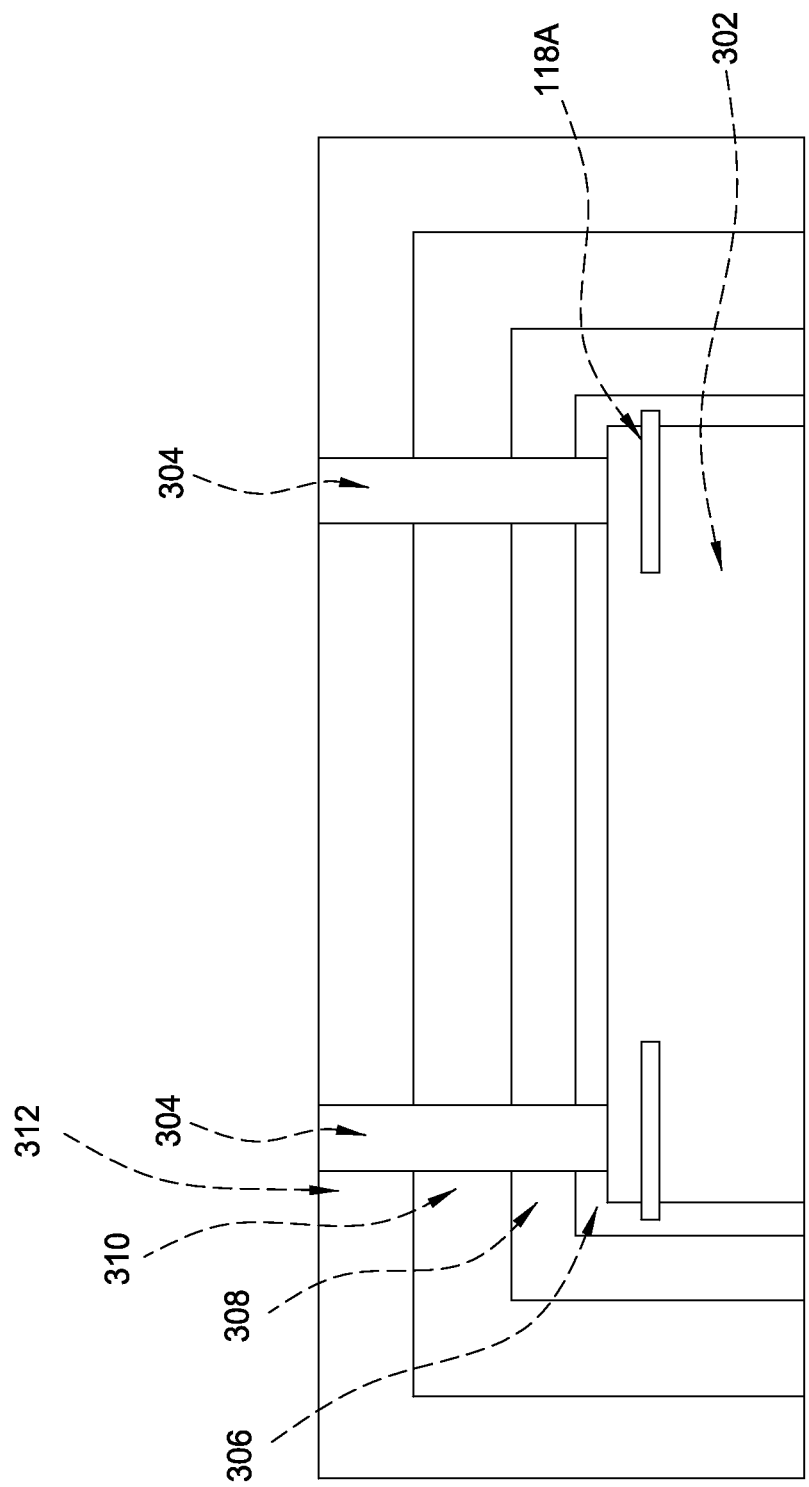
FIGS. 3A and 3B are schematic cross-sectional views of the encapsulating portion of a MEMS device according to one embodiment.
Figure 3B:
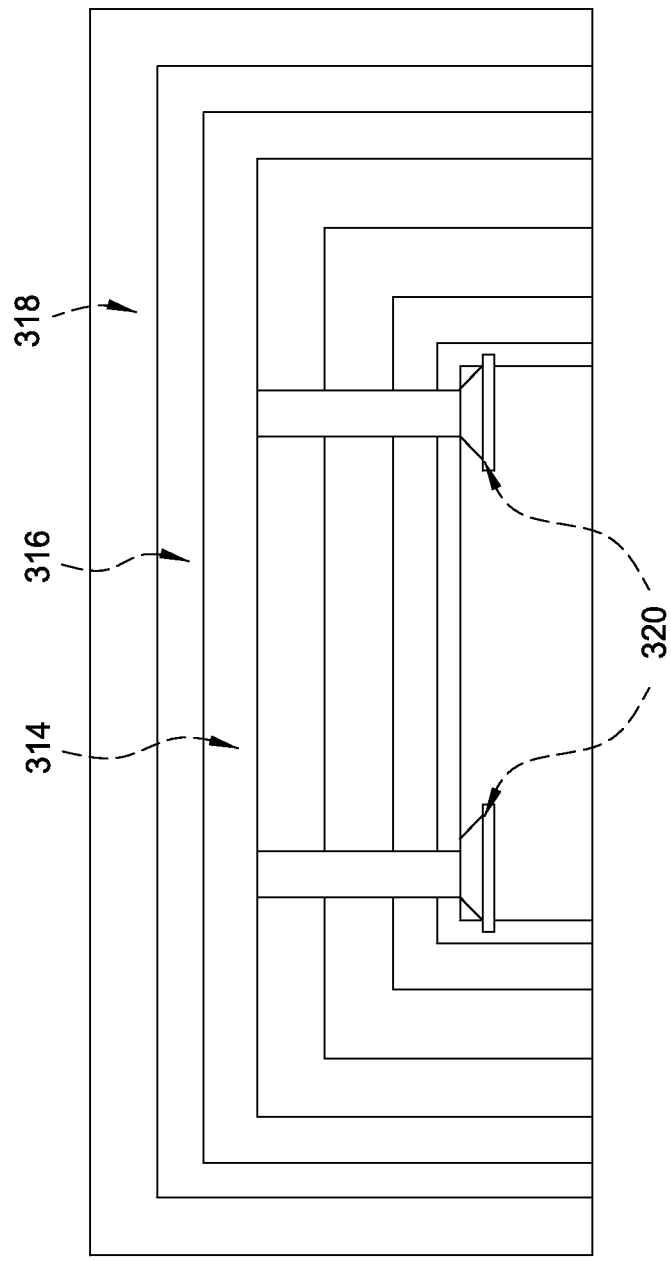

FIGS. 3A and 3B are schematic cross-sectional views of the encapsulating portion of a MEMS device according to one embodiment. As shown in FIG. 3A, the sacrificial material 302 has been generically shown and the first portion 118A of the second structural layer 114 has been shown as well. The remainder of the second structural layer 114, as well as the first structural layer, has not been shown for simplicity.

Once the last sacrificial layer has been deposited, the upper or pull-off 124 electrode may be formed. However, the upper or pull-off electrode 124 comprises a conductive material which could lead to residue within the cavity or poor etching rates when removing the sacrificial material 302. Thus, dielectric material, as discussed above, is deposited over the sacrificial material 302 prior to forming the electrically conductive layer 310 that will become the upper or pull-off electrode 124. In the embodiment shown in FIGS. 3A and 3B, the dielectric material comprises two layers 306, 308; however, it is to be understood that a single dielectric layer may be utilized. In the embodiment shown in FIGS. 3A and 3B, layer 306 is an oxide layer such as silicon oxide deposited to a thickness of between about 20 nm and about 50 nm, such as about 40 nm. Layer 308 is a nitride layer such as silicon nitride deposited to a thickness of between about 200 nm and about 400 nm. Layers 306, 308 may be deposited by a well known deposition process such as PECVD. When only a single dielectric layer is used, the single dielectric layer may comprise an oxide such as silicon oxide or a nitride such as silicon nitride. The overall thickness of a single layer dielectric material should be between about 200 nm and about 400 nm, such as between about 280 nm and about 320 nm.

Above the dielectric layer, the electrically conductive layer 310 is deposited to a thickness of between about 400 nm and about 550 nm, such as about 500 nm. The materials for the electrically conductive layer 310 are discussed above. The electrically conductive layer 310 may be deposited as discussed above. Above the electrically conductive layer 310, a dielectric conformal layer 312 is deposited. Suitable thicknesses for the conformal layer 312 are between about 1800 nm and about 2100 nm, such as about 2000 nm. In one embodiment, the conformal layer 312 may comprise a tetra-ethyl-ortho-silicate (TEOS) based oxide. The conformal layer 312 may be deposited by a well known deposition processes such as PECVD. The collective thickness of the electrically conductive layer 310 and the conformal layer 312 is chosen to ensure the cavity roof does not collapse once the sacrificial material 302 is removed. After depositing the conformal layer 312, release holes 304 are formed through layers 306, 308, 310 and 312 to expose the sacrificial material 302. The sacrificial material is then removed as discussed above.

After the release of the sacrificial material 302, another multi-layer stack is deposited for shape control as shown in FIG. 3B. The first layer 314 is deposited by HDP-CVD as discussed above to seal the release holes 304. The HDP-CVD material lands on the first portion 118A and should extend within the cavity no further than the edge 320 of the first portion 118A and thus not interfere with operation of the switching element. In fact, as discussed above, layer 314, because it is deposited onto the first portion 118A, helps anchor the device within the cavity. In one embodiment, layer 314 has a thickness of between about 900 nm and about 1050 nm, such as about 1000 nm. Suitable materials for the sealing layer 314 are discussed above.

The HDP-CVD sealing layer 314 may not have a uniform surface. Thus, a conformal layer 316 is deposited thereover. In one embodiment, the conformal layer 316 comprises a TEOS based oxide and has a thickness between about 900 nm and about 1050 nm, such as about 1000 nm. A passivation layer 318 is then deposited thereover. In one embodiment, the passivation layer 318 may comprise silicon nitride and have a thickness of between about 800 nm and about 1000 nm, such as about 850 nm.

Figure 4A:
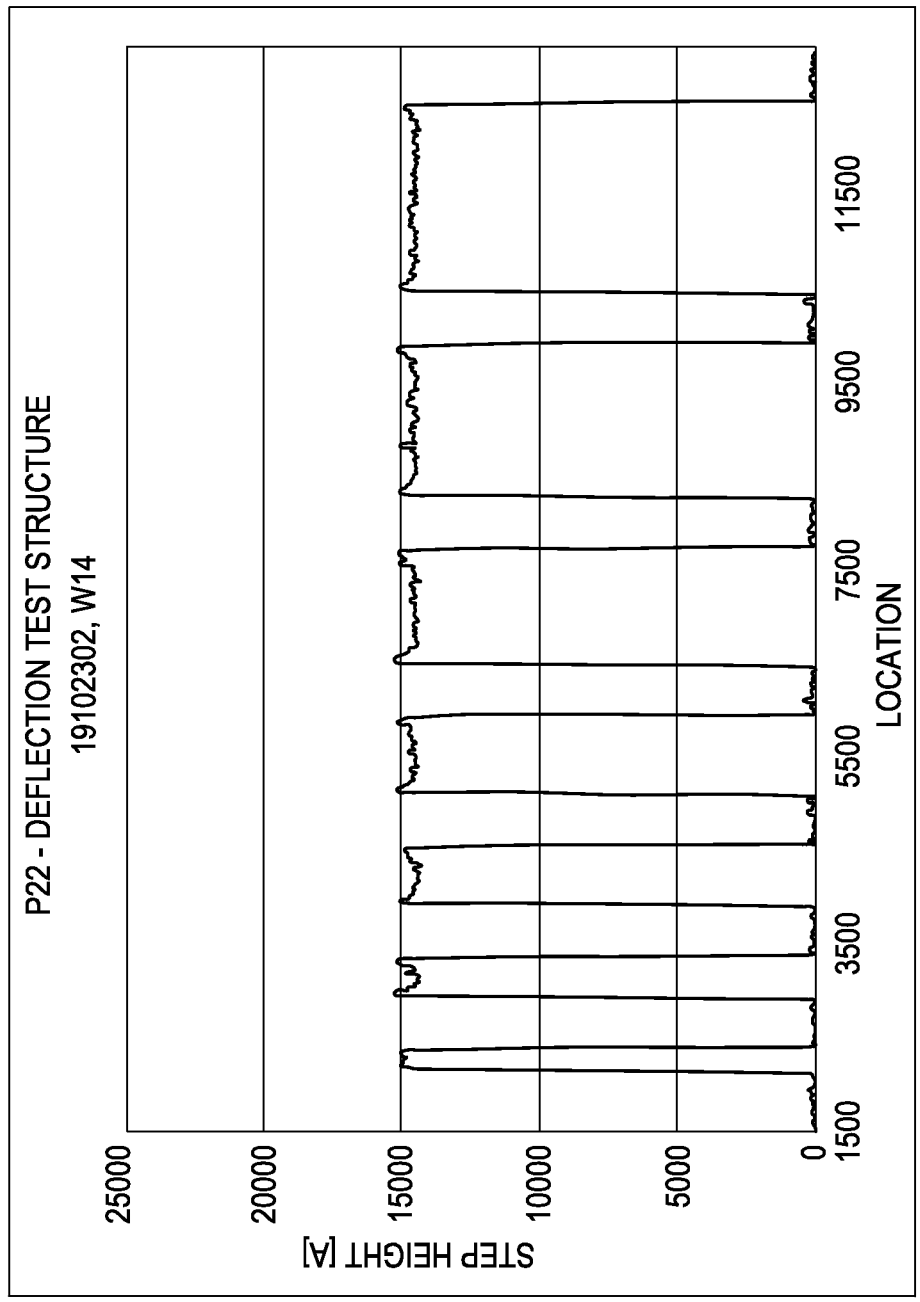
FIGS. 4A-4C are graphs illustrating the profiles of different width cavities before and after release without any of the features discussed herein.
Figure 4B:
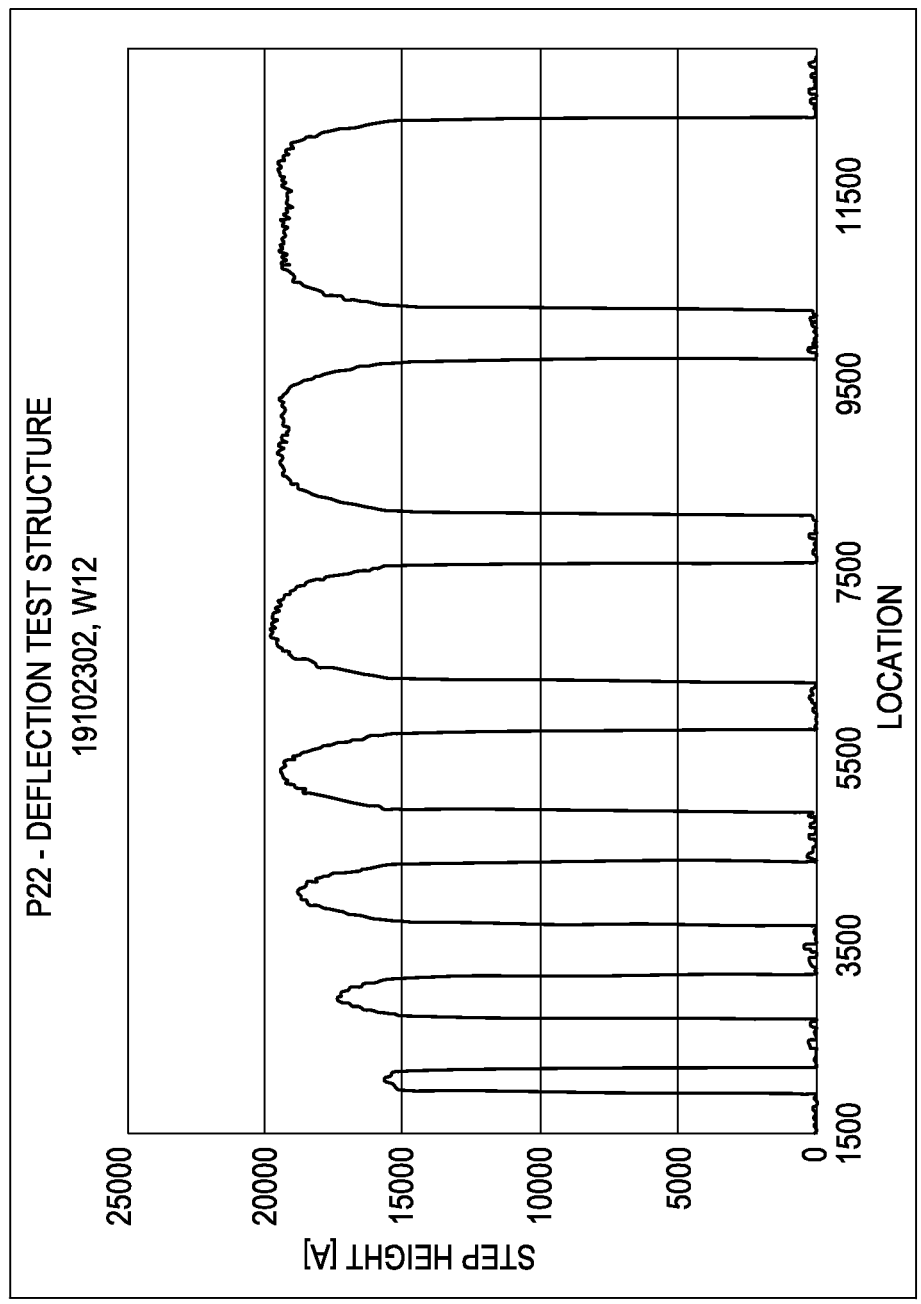
Figure 4C:
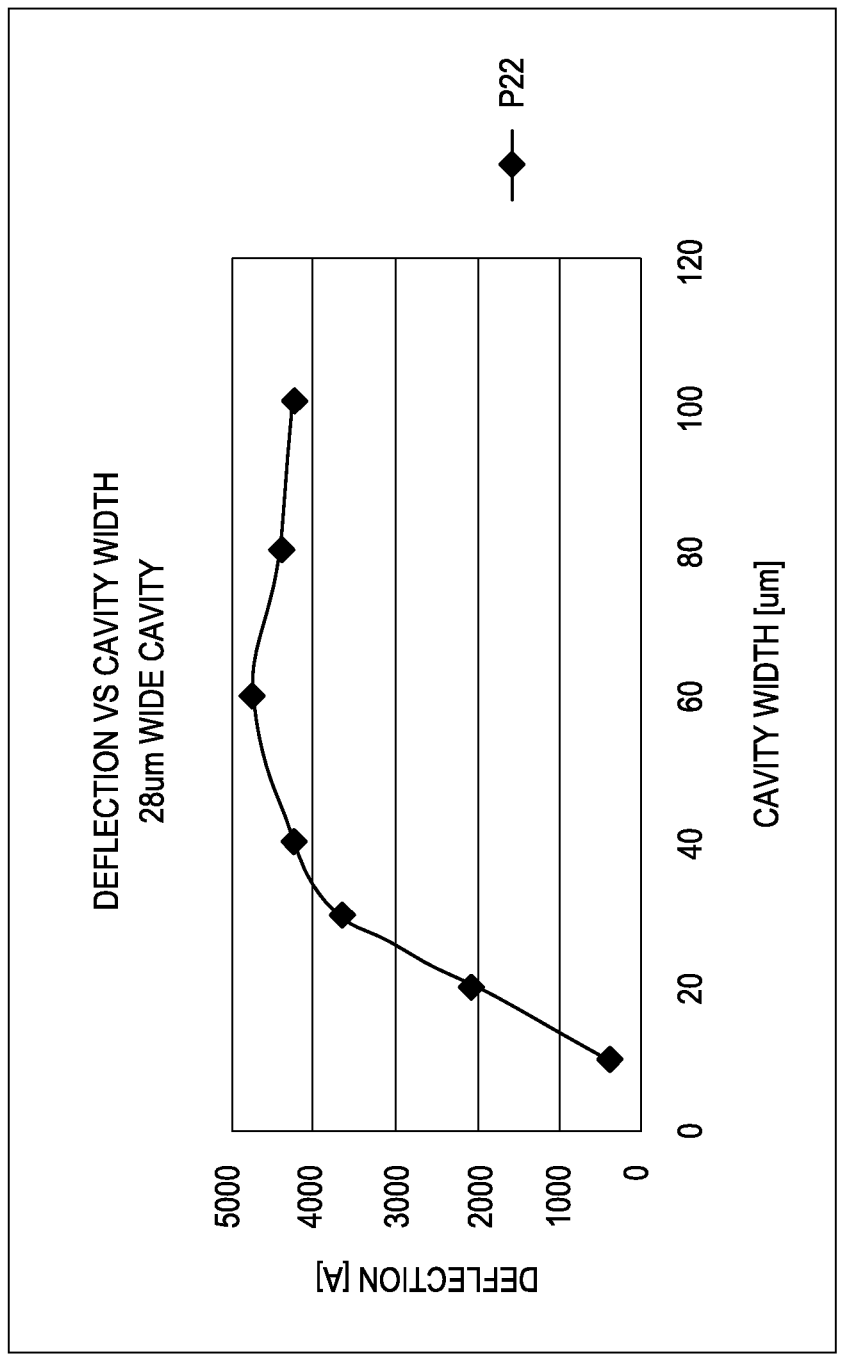

FIGS. 4A-4C show the profiles measured for cavities of different widths for the unreleased and released cases. FIG. 4A shows the results of a deflection test structure for an unreleased switching element. FIG. 4B shows the results of the deflection test structure after the switching element has been released. As shown in FIG. 4B, increasing the width of the cavity yields on a larger deflection with a maximum. FIG. 4C shows the deflection verses the cavity width for a 28 micrometer cavity.

The final encapsulation layer is a stack of seven layers (i.e., 306, 308, 310, 312, 314, 316 and 318). The materials chosen for the layers, as well as the deposition conditions for each layer, affect the cavity deflection. For example, utilizing HDP-CVD for sealing layer 314 limits the amount of material that will spread out within the cavity yet also deposit on the first portion 118A to help anchor the switching element. Other deposition processes, such as electroplating, CVD or PVD could either result in deposition on undesired areas of the cavity or no anchoring of the first portion 118A.

EXAMPLE

When a debonded area is subject to stress, an out-of-plane deflection could occur (commonly called buckling). The threshold level at which buckling occurs is a function of: (a) the geometry and size of the debonded area (free-standing cap), (b) the material & thickness of the cap, (c) the stress in the cap, (d) the Temperature change the cap will see and (e) the anchoring.

The threshold at which buckling could occur as well as the post-buckling response can be easily calculated for two simple geometry cases: a strip of uniform width and a circular patch. In the case of a strip of uniform width, the compressive level required to induce an out-of-plane deflection in a film with debonded zone of size $a_m$ is:

$$\sigma_m = -\frac{\pi^2 \overline{E_f}}{12}\left(\frac{h_f}{a_m}\right)^2 \text{ with } \overline{E_f} = \frac{E_f}{1-v_f^2}$$

Where $E_f$ is the elastic modulus, $u_f$ is Poisson ratio, $a_m$ is the debonded zone width and $h_f$ is the film thickness. In the case of a circular patch, the relationship is approximated by the following:

$$\sigma_m = -1.2235 \overline{E_f}\left(\frac{h_f}{a_m}\right)^2$$

Assuming a 1 um oxide cap deposited at 350 degrees Celsius and having a 80 MPa compressive intrinsic stress at the temperature of deposition. After release etch, a large area of the oxide cap is, on-purpose, debonded and only a small area still remain anchored on silicon. Now, if it is assumed that a maximum debonded area of 60 um in diameter, the subsequent handling and sealing step would have to be performed at a temperature range guaranteeing that no out of plane deflection would occur. By assuming a Young's modulus of 70 GPa and a Poisson ratio of 0.2 for oxide, the mismatch stress would cause the film to buckle once a compressive stress of 100 MPa would have been reached. The corresponding thermal stress being:

$$\sigma_{th} = \frac{E_f}{1-v} * (\alpha_f - \alpha_s) * (T_{dep} - T)$$

A temperature difference of 110 degrees Celsius was obtained.

$(\alpha_{oxide} = 0.5*10^{-6} K^{-1}, \alpha_{silicon} = 2.6*10^{-6} K^{-1})$

This means the substrate should stay within 240 degrees Celsius to 350 degrees Celsius from the time where the cap was partially debonded (end of the release etch step) up to the time where a strong enough seal has been performed (end of the curtain process/beginning of the seal). The release etch and sealing would ideally be performed in a module containing three chambers: a PECVD chamber to perform release etch, an HDP-CVD chamber to perform the sealing step and the gap fill and a PECVD chamber to perform the cap oxide deposition prior subsequent CMP.

Because the sealing layer and the electrically conductive material that is used to form the pull-off electrode are both coupled to the anchor portion of the switching element, the anchor portion of the switching element is less likely to detach from the ground electrodes.

While the foregoing is directed to embodiments of the present invention, other and further embodiments of the invention may be devised without departing from the basic scope thereof, and the scope thereof is determined by the claims that follow.

The invention claimed is:

1. A micro-electromechanical device, comprising:
   a first electrode;
   a second electrode;
   one or more dielectric layers disposed above the second electrode;
   one or more release holes formed though the one or more dielectric layers;
   a switching element movable between the first electrode and the second electrode and disposed within a cavity; and
   a sealing layer disposed over the one or more dielectric layers and within the one or more release holes, at least a portion of the sealing layer is in contact with at least a portion of the switching element.

2. The device of claim 1, wherein the second electrode is disposed above the switching element and is electrically connected to an electrical contact that is disposed below the switching element.

3. The device of claim 2, wherein the cavity is defined by walls that comprise electrically conductive material that is coupled to ground.

4. The device of claim 1, wherein the cavity is defined by walls that comprise dielectric material.

5. The device of claim 4, wherein the dielectric material is in contact with the switching element.

6. The device of claim 1, wherein the cavity is defined by walls that comprise electrically conductive material that is coupled to ground.

7. The device of claim 6, wherein the electrically conductive material is in contact with the switching element.

8. The device of claim 1, further comprising:
   a first dielectric layer disposed on the second electrode and in between the switching element and the second electrode;
   a second dielectric layer disposed on the second electrode opposite the first dielectric layer;
   the sealing layer disposed on the second dielectric layer;
   a third dielectric layer disposed on the sealing layer; and
   a passivation layer disposed on the third dielectric layer.

9. The device of claim 8, wherein the first dielectric layer comprises multiple dielectric layers and wherein the multiple dielectric layers comprise at least one of a nitride layer and an oxide layer.

10. The device of claim 8, wherein the third dielectric layer is a conformally deposited dielectric layer.

11. A micro-electromechanical device, comprising:
    a first waffle patterned switching element disposed within a cavity, the switching element having at least one anchor portion and a flexible portion;
    a pull-in electrode disposed below the first waffle patterned switching element;

a pull-off electrode disposed above the first waffle patterned switching element; and walls that surround the cavity, at least a portion of at least one wall of the plurality of walls is coupled to the at least one anchor portion, wherein the walls that surround the cavity and the pull-off electrode are comprised of the same material.

12. The device of claim 11, further comprising a second waffle patterned switching element disposed within the cavity.

13. The device of claim 12, wherein the plurality of walls are electrically conductive.

14. The device of claim 13, wherein the plurality of walls are coupled to ground.

15. The device of claim 14, further comprising a sealing layer encapsulating the cavity, wherein the sealing layer is in direct contact with the at least one anchoring portion.

16. The device of claim 11, wherein the cavity is defined by walls that comprise dielectric material.

17. The device of claim 16, wherein the dielectric material is in contact with the switching element.

18. A micro-electromechanical device, comprising:
one or more first electrodes formed within a substrate;
a second electrode spaced from the one or more first electrodes and electrically connected to an electrical contact embedded within the substrate;
a plurality of switches that are each movable between the one or more first electrodes and the second electrode within a cavity;
one or more dielectric layers disposed above the second electrode;
one or more release holes formed though the one or more dielectric layers; and
a sealing layer disposed over the one or more dielectric layers and within the one or more release holes, at least a portion of the sealing layer is in contact with at least a portion of the plurality of switches.

19. The device of claim 18, wherein the cavity is bound by walls and the walls are in direct contact with the plurality of switches.

20. The device of claim 19, wherein the cavity is encapsulated with a sealing layer that is in direct contact with the plurality of switches.

21. The device of claim 20, wherein the walls are electrically grounded.

22. The device of claim 21, wherein the second electrode is spaced from the walls by the sealing layer.

23. A micro-electromechanical device fabrication method, comprising:
fabricating a switching element on a substrate, the switching element comprising an anchor portion and a flexible portion;
depositing an electrically conductive layer above the switching element and in contact with the anchor portion;
patterning the electrically conductive layer to form a first portion that remains in contact with the anchor portion and a pull-off electrode that is electrically isolated from the first portion;
depositing a dielectric layer above the electrically conductive layer;
forming one or more release holes through the dielectric layer; and
depositing a sealing layer over the dielectric layer and within the one or more release holes.

24. The method of claim 23, wherein the pull-off electrode is electrically coupled to an electrical contact that is disposed below the switching element.

25. The method of claim 24, wherein the switching element is disposed within a cavity and the method further comprises depositing a sealing layer to encapsulate the cavity, wherein the sealing layer is in direct contact with the anchor portion.

26. The method of claim 23, wherein the switching element is disposed within a cavity, the method further comprising:
depositing a dielectric roof over the electrically conductive layer;
forming a release hole through the dielectric roof that is axially aligned with the anchor portion; and
depositing a sealing layer over the dielectric roof, within the release hole and in contact with the anchor portion.

27. The method of claim 26, wherein the first portion is electrically grounded.

* * * * *